United States Patent [19]

Stein

[11] 4,403,396
[45] Sep. 13, 1983

[54] SEMICONDUCTOR DEVICE DESIGN AND PROCESS

[75] Inventor: Richard J. Stein, Stow, Mass.

[73] Assignee: GTE Laboratories Incorporated, Waltham, Mass.

[21] Appl. No.: 334,393

[22] Filed: Dec. 24, 1981

[51] Int. Cl.³ .................. H01L 21/265; H01L 21/302
[52] U.S. Cl. ................................... 29/571; 29/576 B; 29/578; 29/579; 148/1.5; 357/15; 357/22
[58] Field of Search ............... 29/571, 576 B, 579, 29/578; 148/1.5; 357/22, 15; 156/647

[56] References Cited

U.S. PATENT DOCUMENTS

| | | | |
|---|---|---|---|
| 3,755,001 | 8/1973 | Kooi | 357/15 |
| 3,938,241 | 2/1976 | George | 29/571 |
| 3,999,281 | 12/1976 | Goronkin | 29/578 |
| 4,115,793 | 9/1978 | Nishizawa | 357/22 |
| 4,140,558 | 2/1979 | Murphy | 156/653 |
| 4,262,296 | 4/1981 | Shealy | 357/22 |
| 4,315,782 | 2/1982 | Tarng | 29/576 B |
| 4,326,209 | 4/1982 | Nishizawa | 357/22 |
| 4,329,772 | 5/1982 | Oikawa | 357/22 |
| 4,356,211 | 10/1982 | Riseman | 156/653 |

FOREIGN PATENT DOCUMENTS 2026237  1/1980  United Kingdom ............. 357/22 E

OTHER PUBLICATIONS

"High-Frequency High-Power Static Induction Transistor", Nishizawa et al., *IEEE Transactions on Electron Devices,* vol. Ed-25, No. 3, Mar. 1978, 9 pp.

"Recessed Gate Junction Field Effect Transistors", Baliga, *International Electron Devices Meeting,* IEEE, Dec. 8-9-10, 1980, Wash. D. C., 3 pp.

*Primary Examiner*—L. Dewayne Rutledge
*Assistant Examiner*—J. J. Zimmerman
*Attorney, Agent, or Firm*—J. Stephen Yeo; Theodore D. Lindgren

[57] ABSTRACT

A method for fabricating a gate-source structure for a recessed-gate static induction transistor. Source impurities are implanted prior to forming the recessed gates. The recessed gates are formed by a first isotropic etching step and a second anisotropic etching step which results in a unique overhanging protective layer used to protect the walls of the grooves during implantation of gate impurities in the bottom of the grooves. Implantations are driven and activated to form gate and source regions, the protective layer is removed and metal deposited to form electrodes. The procedure minimizes the required number of masking steps and associated mask registration problems.

6 Claims, 5 Drawing Figures

SEMICONDUCTOR DEVICE DESIGN AND PROCESS

BACKGROUND OF THE INVENTION

This invention relates to fabrication techniques for vertically structured semiconductor devices and, in particular, to a recessed structure which requires relatively simple fabrication techniques.

One example of a vertically structured semiconductor device is a static induction transistor (SIT) which is a field effect semiconductor device capable of operation at relatively high frequency and power. These transistors generally have a short, high resistivity semiconductor channel which may be controllably depleted of carriers. The current-voltage characteristics of the static induction transistor are generally similar to those of a vacuum tube triode. The devices are described by Nishizawa et al in U.S. Pat. No. 3,828,230 issued Aug. 6, 1974 and in U.S. Pat. No. 4,199,771 issued May 22, 1980.

The static induction transistor generally uses a vertical geometry with source and drain electrodes placed on opposite sides of a thin, high-resistivity layer of one conductivity type. Gate regions of the opposite conductivity type are positioned in the high resistivity layer on opposite sides of the source. During operation a reverse bias is applied between the gate region and the remainder of the high resistivity layer causing a depletion region to extend into the channel below the source. As the magnitude of the reverse bias voltage is varied, the source-drain current and voltage derived from an attached energy source will also vary.

The design and fabrication of the gate-source structure of vertical-geometry static induction transistors is difficult. In order to operate at high frequencies and low voltages, such devices must be built under extremely tight dimensional control. Involved dimensions are in the micrometer range, requiring photolithographic alignments with submicrometer precision. Many photolithographic steps are required to define the device, with unnecessary steps being used to define the source area after definition of the gate area. Similar considerations must be taken into account in fabricating other vertically structured devices.

A large diversity of prior art exists in fabrication of vertical structures for semiconductor devices. The structure of a static induction transistor, in particular, has been accomplished by means including anisotropic etching, epitaxial regrowth, and controlled impurity diffusion. A common characteristic of these prior methods of fabricating vertically structured semiconductor devices is that contact or source impurity material is applied to the surface of the semiconductor material after the gate regions are defined. Copending U.S. patent application No., entitled "High Frequency Static Induction Transistor," invented by Adrian I. Cogan and assigned to the same assignee as this application, discloses an alternate method for applying source impurity material prior to gate impurity material in fabricating a static induction transistor.

SUMMARY OF THE INVENTION

The present invention relates to a method for fabricating a semiconductor device having a vertical structure, the fabrication method using a novel sequence of steps which provide several advantages over prior art methods and structures.

The primary novel feature of this invention is the implantation or deposition of contact impurities prior to lithographic definition of recessed areas. The novel feature allows self-alignment of source and gate in static induction transistors or equivalent structures in other vertically structured semiconductor devices. A second novel feature of the invention allows recessed or gate definition by deposition of impurities such as by ion implantation after creation of a controllable overhang in a masking level. In addition to self-aligning of the surface and recessed patterns, the present invention requires fewer masking steps, including no masking step for metallization of electrodes.

The first step of the invention is the deposition of impurities on a surface of a semiconductor material. A protective layer such as a silicon nitride or silicon dioxide masking layer is then formed on the surface overlying the impurities. A photoresist pattern is then deposited and windows are patterned. The protective layer is removed in the area of the windows by a wet etching or a plasma etching process. The photoresist pattern is removed and the semiconductor material exposed by the windows is etched to form grooves of a desired depth greater than the width thereof. The bottoms of the grooves are also at least as wide as the tops thereof. Impurities are then deposited at the bottom of the grooves to form regions of conductivity type opposite to the conductivity type of the starting semiconductor material. The remainder of the silicon nitride or silicon dioxide layer is then stripped and metal is deposited on the stepped structure to form electrodes.

The Elements of the Figures are not drawn to scale and the Figures are intended only for use in explanation of fabrication steps.

DETAILED DESCRIPTION OF THE INVENTION

The invention will be described in detail with reference to a static induction transistor, however those skilled in the art will realize that the fabrication process or method described is also applicable to other vertically structured semiconductor devices as well. The invention is generally applicable to the fabrication of devices where it is advantageous to vertically separate regions and contacts such as the source and gate of a static induction transistor. The invention is applicable to devices fabricated from a variety of semiconductor materials such as silicon or Group III–V compounds.

A wafer, or substrate, of single crystal semiconductor material is commonly provided as the supporting structure for fabrication of a vertical-geometry semiconductor device, field-effect semiconductor device, or static induction transistor. The substrate is commonly of silicon with n-type impurities and a resistivity on the order of 0.01 to ten ohm-centimeters. The gate-source structure of a static induction transistor is formed in a thin, high resistivity epitaxial layer, with a resistivity normally greater than thirty ohm-centimeters of the same conductivity type as the substrate grown on the upper surface of the substrate. The following description and the drawings relate to the gate-source structure or equivalent structure only. The underlying substrate and the drain electrode commonly deposited on the under surface of the substrate of a static induction transistor are neither illustrated nor discussed.

Figure 1:
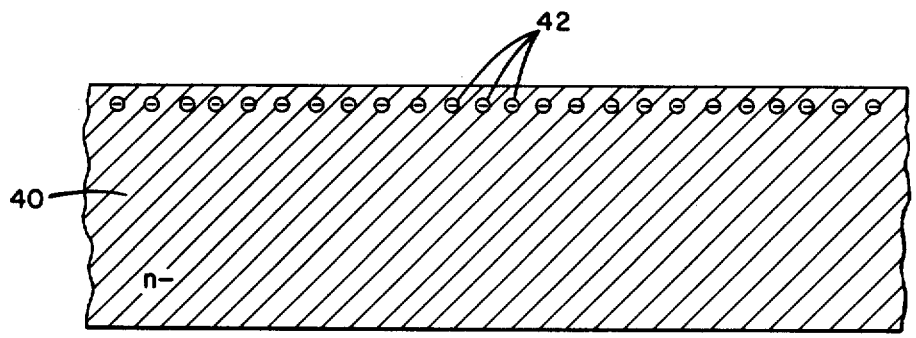
FIG. 1 is a cross-sectional view of a high resistivity epitaxial layer of a semiconductor wafer after implantation of source impurities.

FIG. 1 illustrates a fragment of a high resistivity epitaxial layer 40. The thickness of layer 40 is determined according to device application in accordance with known criteria, i.e., thinner for high frequency applications and thicker for power devices. Layer 40 may be comprised, for example of (110) orientation material where wet etching is used in the subsequent steps of the present invention. Source impurities 42 are deposited in the manner surface of epitaxial layer 40 which can be accomplished, as illustrated, by ion implantation and subsequent processing. The implanted source impurities 42 may be, for example, arsenic and the implantation may be accompanied by conventional masking steps to confine implantation to a particular region of the surface of epitaxial layer 40.

Figure 2:
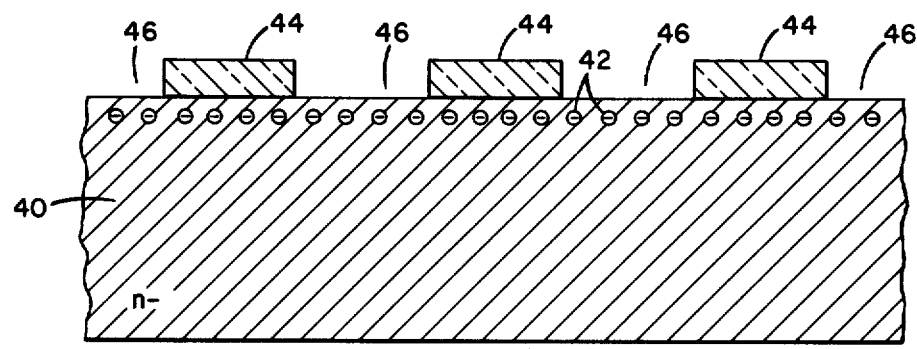
FIG. 2 is a cross-sectional view of the same epitaxial layer after etching of gate windows in a silicon nitride or silicon dioxide layer which has been previously formed on the wafer.

As illustrated in FIG. 2, protective layer 44 is formed on the upper surface of epitaxial layer 40. Protective layer 44 may be of silicon nitride, Si$_3$N$_4$, or of silicon dioxide, SiO$_2$. Gate windows 46 are etched in protective layer 44 using conventional wet etching or plasma etching and associated masking.

Figure 3:
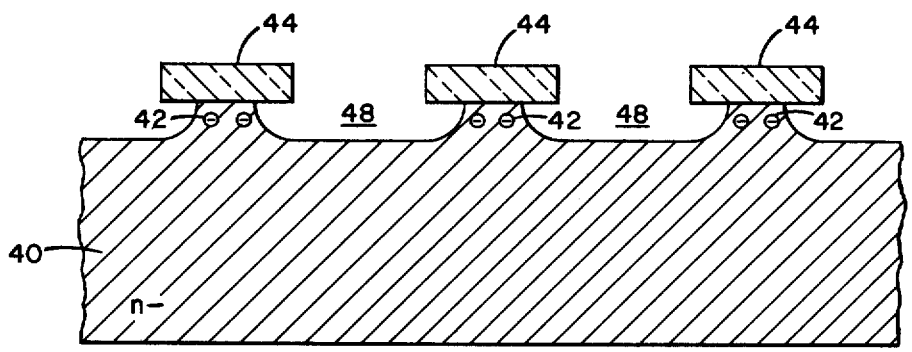
FIG. 3 is a cross-sectional view of the same epitaxial layer illustrating initial isotropical etching to undercut the silicon nitride or silicon dioxide layer and begin formation of the recessed gate grooves.
Figure 4:
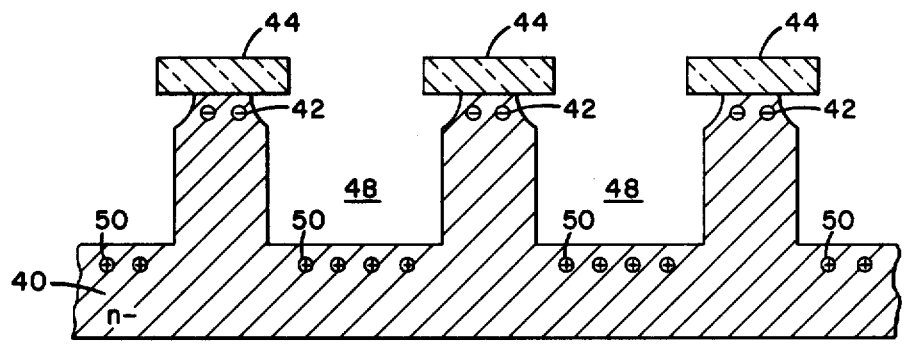
FIG. 4 is a cross-sectional view of the same epitaxial layer illustrating the result of anisotropical etching to deepen the recessed gate grooves and illustrating implantation of gate impurities.

Recessed gate grooves 48 are then etched which can be done in two stages, as illustrated in FIG. 3 and in FIG. 4 or alternatively in a single stage. The first stage of two stage etching is illustrated in FIG. 3 and consists of isotropical etching to both form part of the depth of gate grooves 48 and at the same time controllably undercut a part of protective layer 44. During isotropical etching the undercut of layer 44 will be approximately equal to the depth of the etch. The second stage of etching is illustrated in FIG. 4 and consists of anisotropically etching to form vertical gate grooves having a depth equal to that of desired gate depth. The grooves, as is illustrated, have substantially vertical side walls and a width substantially equal to the width of the groove as determined by the first stage of etching.

Alternatively, a single anisotropically etching step may be performed to form grooves 48 to the desired depth. In typical devices windows 46 will be on the order of one to four microns wide and grooves 48 will be on the order of five to fifteen microns deep with an aspect ratio greater than one and less than ten. The source islands will be on the order of one micron to several microns wide. Grooves 48 are illustrated with vertical walls to provide separation between the source and gate regions during subsequent implant and metallization processing, however, the grooves may also be trapezoidal with the bottoms wider than the tops.

FIG. 4 also illustrates deposition of impurities which can be done by ion implantation of gate impurities 50. The implanted gate impurities 50 may be, for example, boron. The implantation or other deposition of impurities requires no additional masking steps because of the overhang associated with protective layer 44. The impurities are substantially confined to the bottom surface of gate grooves 48 and to an area within that surface defined by the overhangs associated with protective layer 44.

Figure 5:
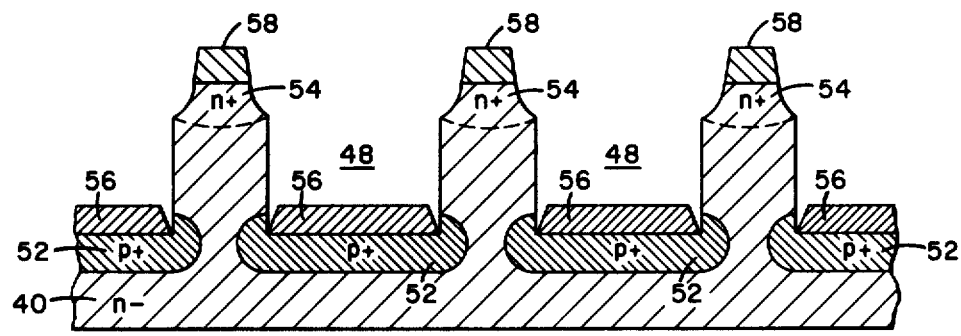
FIG. 5 is a cross-sectional view of the gate-source structure illustrating gate and source regions after activation and illustrating deposit of metal gate and source electrodes.

As illustrated in FIG. 5, when the gate and source impurities 50 and 42 are implanted, they are then driven and activated using conventional means to form gate regions 52 and source regions 54 in epitaxial layer 40. Protective layer 44 is then removed and metal deposited by evaporation to form gate electrodes 56 and source electrodes 58, also illustrated in FIG. 5. No masking steps are required for the procedures associated with FIG. 5.

Finally, the structure may be passivated, if necessary, and bond contacts may be opened.

During operation of the gate-source structure formed according to the method of this invention, a time-varying reverse bias voltage is applied to gate region 52 and the remainder of epitaxial layer 40. The depletion region expands and contracts to vary the current and associated voltage of the channels extending from source electrodes 58 through epitaxial layer 40 to the substrate and the drain electrode which are not shown.

I claim:

1. A method for forming a structure for a vertically structured semiconductor device comprising:
    depositing impurities on a surface of a semiconductor material of a first conductivity type to uniformly increase the impurity concentration of a contact layer adjacent said surface sufficient to provide contact areas on said surface;
    forming a protective layer over said surface;
    opening windows through said protective layer;
    isotropically etching grooves into said semiconductor material to form partial grooves underlying said windows to a depth through said contact layer and greater than the width of said grooves;
    anisotropically etching to deepen said grooves beneath said windows, the bottom of each of said grooves being at least as wide as the top thereof;
    depositing impurities into said semiconductor material at the bottom of said grooves to form a semiconductor region of a second conductivity type opposite said first conductivity type at the bottom of each of said grooves, the semiconductor regions at the bottom of adjacent grooves forming a channel therebetween from said contact layer to a bulk region of said semiconductor material;
    removing said protective layer; and
    depositing metal over said surface whereby said metal deposits on said contact area and on the bottom of each of said grooves, the walls of said grooves providing isolation between the metal on said contact areas and the metal on the bottoms of said grooves.

2. A method as defined in claim 1 wherein said steps of depositing impurities are performed by the steps of implanting ions and driving and activating the implanted ions.

3. A method for forming a gate-source structure for a static induction transistor, said method comprising:

forming a high resistivity epitaxial semiconductor layer;

depositing source impurities on a surface of said epitaxial layer;

forming a protective layer over said surface;

opening gate windows through said protective layer;

isotropically etching said semiconductor layer to form partial gate grooves extending below said gate windows; anisotropically etching to deepen said grooves beneath said windows to a predetermined depth greater than the width thereof, the bottom of said of said gate grooves being at least as wide as the top thereof;

depositing gate impurities on the bottoms of said gate grooves;

removing said protective layer; and depositing metal on said source regions and said gate regions to form source and gate electrodes respectively.

4. A method as defined in claim 3 wherein said steps of depositing impurities are performed by the steps of implanting ions and driving and activating the implanted ions.

5. A method as defined in claim 3, wherein the ratio of the depth to width of said grooves is greater than one and less than ten.

6. A method as defined in claim 5 wherein the depth of said grooves is in the range of about five to fifteen microns, the width of the semiconductor material between adjacent grooves is greater than about one micron.

* * * * *